(12) United States Patent
Kaneda

(10) Patent No.: US 7,473,118 B2
(45) Date of Patent: Jan. 6, 2009

(54) RESIN SEALING TYPE CIRCUIT DEVICE

(75) Inventor: Yoshimasa Kaneda, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/790,393

(22) Filed: Apr. 25, 2007

(65) Prior Publication Data

US 2008/0020620 A1    Jan. 24, 2008

(30) Foreign Application Priority Data

Jul. 21, 2006  (JP) .............................. 2006-199384

(51) Int. Cl.
 *H01R 13/52* (2006.01)
(52) U.S. Cl. ..................... 439/281; 439/606; 439/936
(58) Field of Classification Search ................. 439/275, 439/276, 281, 587, 604, 605, 606, 932, 933, 439/936
See application file for complete search history.

(56) References Cited

U.S. PATENT DOCUMENTS

| 5,550,750 | A | * | 8/1996 | Wolff | ........................... 716/10 |
| 5,703,542 | A | * | 12/1997 | Blandino | ....................... 331/70 |
| 6,390,854 | B2 | | 5/2002 | Yamamoto et al. | |
| 6,729,889 | B2 | * | 5/2004 | Bauer | ........................... 439/67 |
| 6,749,462 | B2 | * | 6/2004 | Sun et al. | ..................... 439/604 |
| 2002/0006749 | A1 | | 1/2002 | Yamamoto et al. | |
| 2008/0020620 | A1 | * | 1/2008 | Kaneda | ....................... 439/281 |

FOREIGN PATENT DOCUMENTS

| JP | A-61-264744 | 11/1986 |
| JP | A-07-115170 | 5/1995 |
| JP | A 2002-033438 | 1/2002 |

* cited by examiner

*Primary Examiner*—James Harvey
(74) *Attorney, Agent, or Firm*—Oliff & Berridge, PLC

(57) ABSTRACT

A resin sealing type circuit device is disclosed having a circuit case, made of resin, which has a recessed portion, a plurality of circuit elements accommodated in the recessed portion and having lead terminals, respectively, wiring metal segments fixedly supported with the circuit case and having lead terminal connecting portions protruding into the recessed portion, and a sealing resin filled in the recessed portion and covering the plurality of circuit elements and the lead terminal connecting portions of the wiring metal segments, wherein placements of the plurality of circuit elements are determined in consideration for a temperature distribution of the sealing resin.

10 Claims, 2 Drawing Sheets

RESIN SEALING TYPE CIRCUIT DEVICE

CROSS REFERENCE TO RELATED APPLICATIONS

This application is related to Japanese Patent Application No. No. 2006-199384, filed on Jul. 21, 2006, the content of which is hereby incorporated by reference.

BACKGROUND OF THE INVENTION

1. Technical Field of the Invention

The present invention relates to a resin sealing type circuit devices installed on vehicle alternators or the like and, more particularly, to a resin sealing type circuit device with improved temperature distribution.

2. Description of the Related Art

In the related art, an attempt has heretofore been made to provide a resin sealing type circuit device formed with a recessed portion for accommodating circuit elements as disclosed in, for instance, Japanese Patent Unexamined Application Publication No. 2002-33438. With such a related art resin sealing type circuit device, a circuit case has a recessed portion in which a plurality of circuit elements are wired. The circuit case is filled with sealing resin covering a whole of the plurality of circuit elements.

With such a related art resin sealing type circuit device, a heating element is supported with the circuit case in close proximity to the plurality of circuit elements, accommodated in the recessed portion, and the recessed portion. With such a structure, uneven temperature distribution occurs in sealing resin filled in the recessed portion due to heats of the circuit elements received in the recessed portion and a heating element placed in close proximity to the recessed portion. This causes an issue to arise with a fear of the occurrence of sealing resin peeling from a boundary area between the circuit case and sealing resin or the occurrence of cracking taking place in the sealing resin.

SUMMARY OF THE INVENTION

The present invention has been completed with a view to addressing the above issue and has an object to provide a resin sealing type circuit device that can improve uneven temperature distribution in sealing resin with capability of preventing the occurrence of peeling or cracking of sealing resin.

To achieve the above object, the present invention provides a resin sealing type circuit device comprising a circuit case, made of resin, which has a recessed portion, a plurality of circuit elements accommodated in the recessed portion and having lead terminals, respectively, wiring metal segments fixedly supported with the circuit case and having lead terminal connecting portions protruding into the recessed portion and electrically connected to the lead terminals of the circuit elements, respectively; and a sealing resin filled in the recessed portion and covering the plurality of circuit elements and the lead terminal connecting portions of the wiring metal segments. Placements of the plurality of circuit elements are determined in consideration for a temperature distribution of the sealing resin.

With the placements of the plurality of circuit elements determined in consideration for the temperature distribution of the sealing resin, temperature rises of the sealing resin, resulting from heat developed by the circuit elements, can be dissipated in an efficient fashion. This results in improvement in unevenness in temperature distribution of the sealing resin, making it possible to effectively prevent the occurrence of peeling or cracking of the sealing resin from the circuit case.

Further, with the resin sealing type circuit device, the plurality of circuit elements may be preferably placed on the same plane parallel to an opening surface of the recessed portion of the circuit case in symmetry with respect to a hypothetical centerline of two opposing inner walls of the recessed portion. In particular, the plurality of circuit elements may be preferably placed in the recessed portion on both sides of the hypothetical centerline to be equaled in a total sum of heat values. This prevents deviation in temperature distribution of the sealing resin, thereby enabling the improvement in unevenness in temperature distribution of the searing resin.

Furthermore, with the resin sealing type circuit device, the circuit case may preferably have one portion receiving therein a heat source other than the circuit elements, and the plurality of circuit elements may be preferably placed on the same plane parallel to an opening surface of the recessed portion of the circuit case at discrete positions distanced from the heat source and have longitudinal axes parallel to a longitudinal axis of the heat source. This enables the heating element and the plurality of circuit elements to develop heats at diffused areas, enabling the improvement in unevenness in temperature distribution of the sealing resin filled in the recessed portion of the circuit case.

Moreover, with the resin sealing type circuit device, the heat source may be preferably located in the circuit case at a position in which a temperature of the sealing resin filled in the recessed portion becomes uneven due to heat developed by the heat source in use. This enables the improvement in unevenness in temperature distribution of the sealing resin resulting when the heating element is located in a position adversely affecting the temperature distribution of the sealing resin.

In addition, with the resin sealing type circuit device, the plurality of circuit elements may be preferably placed in the recessed portion such that the remoter the distance from the heat source, the greater will be the heat value. Thus, by scheming the placements of the plurality of circuit elements in the recessed portion with the account for heat development of the heating element, it becomes possible to further improve unevenness in temperature distribution of the sealing resin under a circumstance where the circuit case carries both the heating element and the plurality of circuit elements.

Further, the resin sealing type circuit device may further preferably comprise a connector section integrally formed with a leading end of the case body and having a concaved portion to which electric terminals, electrically connected to the wiring metal segments fixedly supported with the circuit case, are exposed. With the connector section integrally formed with the circuit case, the circuit device can have a compact and simple structure. In addition, this results in a reduction in production cost of the circuit device.

Further, with the resin sealing type circuit device, the plurality of circuit elements may be preferably placed on the same plane parallel to an opening surface of the recessed portion of the circuit case in symmetry with respect to a hypothetical centerline of two opposing inner walls of the recessed portion. Moreover, the plurality of circuit elements may be preferably placed in the recessed portion on both sides of the hypothetical centerline to be equaled in a total sum of heat values. This prevents deviation from occurring in temperature distribution of the sealing resin, thereby improving unevenness in temperature distribution of the searing resin.

Furthermore, with the resin sealing type circuit device, the circuit case has one portion receiving therein a heat source other than the circuit elements, and the plurality of circuit elements are placed on the same plane parallel to an opening surface of the recessed portion of the circuit case at discrete positions distanced from the heat source and have longitudinal axes parallel to a longitudinal axis of the heat source. This enables the heating element and the plurality of circuit elements to develop heats at diffused areas, thereby improving unevenness in temperature distribution of the sealing resin filled in the recessed portion of the circuit case.

Moreover, with the resin sealing type circuit device, the heat source may be preferably located in the circuit case at a position in which a temperature of the sealing resin filled in the recessed portion becomes uneven due to heat developed by the heat source in use. This enables the improvement in unevenness in temperature distribution of the sealing resin under a circumstance where the heating element is located in a position adversely affecting the temperature distribution of the sealing resin.

In addition, with the resin sealing type circuit device, the plurality of circuit elements may be preferably placed in the recessed portion such that the remoter the distance from the heat source, the greater will be the heat value. Thus, with the plurality of circuit elements placed in the recessed portion of the circuit case at schemed positions with the account for heat development of the heating element, unevenness in temperature distribution of the sealing resin can be further improved under a circumstance where the circuit case carries both the heating element and the plurality of circuit elements.

Further, the resin sealing type circuit device may further preferably comprise a connector section integrally formed with a leading end of the case body and having a concaved portion to which terminals, electrically connected to the wiring metal segments fixedly supported with the circuit case, are exposed, and a heat source disposed in a trailing end of the circuit case in opposition to the connector section. With the connector section integrally formed with the circuit case, the circuit device can be compact and simple in structure. In addition, since the heating element is carried on the circuit case at the trailing end thereof, a vacant area of the circuit case can be effectively utilized with no addition of component parts. This results in reduction in the cumber of component parts of the circuit device, enabling a reduction in production cost.

Furthermore, with the resin sealing type circuit device, the plurality of circuit elements may be preferably placed on the same plane parallel to an opening surface of the recessed portion of the circuit case in symmetry with respect to a hypothetical centerline of two opposing inner walls of the recessed portion. In particular, the plurality of circuit elements may be preferably placed in the recessed portion on both sides of the hypothetical centerline to be equaled in a total sum of heat values. This prevents deviation in temperature distribution of the sealing resin, thereby enabling the improvement in unevenness in temperature distribution of the searing resin.

DETAILED DESCRIPTION OF PREFERRED EMBODIMENTS

Now, resin sealing type circuit devices of various embodiments according to the present invention will be described below in detail with reference to the accompanying drawings. However, the present invention is construed not to be limited to such an illustrated embodiment described below and technical concepts of the present invention may be implemented in combination with other known technologies or other technologies having required functions equivalent to such known technologies.

Figure 1:
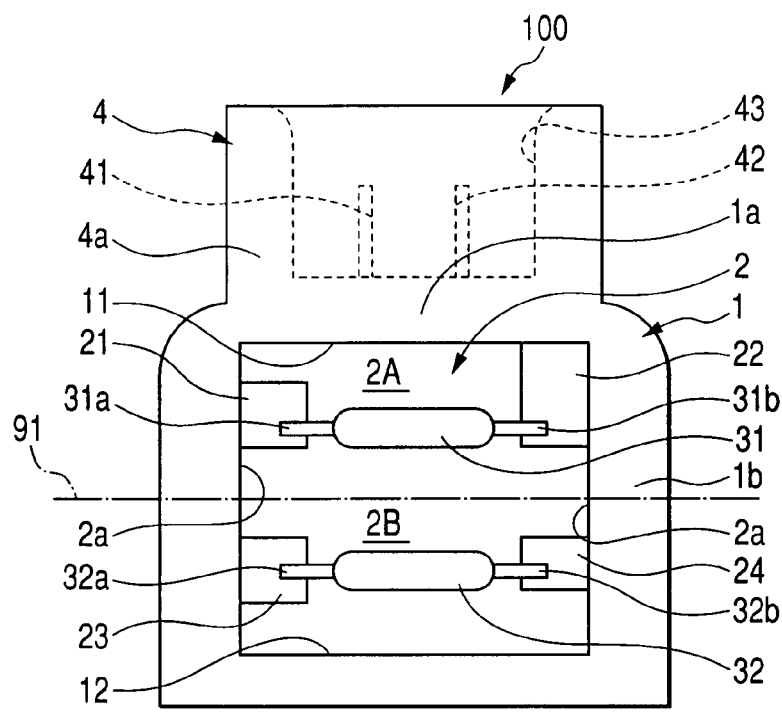
FIG. 1 is a plan view showing a resin sealing type circuit device of one embodiment according to the present invention.

A resin sealing type circuit device of one embodiment according to the present invention will be described below with reference to FIG. 1. FIG. 1 is a plan view of the resin sealing type circuit device of the present embodiment illustrated in a status before the circuit device is filled with sealing resin.

As shown in FIG. 1, a resin sealing type circuit device 100 of the present embodiment takes the form of a regulator with a connector adapted to be installed on, for instance, a vehicle alternator. The resin sealing type circuit device 100 includes a circuit case 1, having a leading end 1a, and a connector section 4 integrally formed with the circuit case 1 through the leading end 1a thereof and having terminals 41, 42. The circuit case 1, made of resign, is integrally molded with the connector section 4 with insert mold-in wiring metal segments 21 to 24. The wiring metal segments 21, 22 form a first pair and the wiring metal segments 23, 24 form a second pair.

The connector section 4, playing a role as a female connector, includes a connector body 4a integrally connected to the circuit case 1 through the leading end 1a thereof and having a leading end formed with a concaved portion 43 to which the terminals 41, 42 are exposed. In use, a male connector (not shown), incorporating connecting terminals corresponding to the terminals 41, 42, is fitted to the connector body 4a of the connector section 4 with the male connector fitted to the concaved portion 43. A seal member such as a sealing rubber or O-ring may be interposed between the connector section 4 and the male connector, thereby ensuring the connector section 4 to provide a hermetically sealing effect in a space for the terminals 41, 42 to be exposed.

The circuit case 1 has a front wall 1b formed with a rectangular recessed portion 2 for various circuit elements to be accommodated. The wiring metal segments 21 to 24, insert molded to the circuit case 1 and fixedly secured to sidewalls 2a, 2a of the recessed portion 2, have terminal end portions exposed to the recessed portion 2 in face-to-face relationships. Rests of the wiring metal segments 21 to 24 extend through the circuit case 1 into the concaved portion 43 acting as the terminals 41, 42 therein.

The recessed portion 2 accommodates therein the circuit elements 31, 32. The circuit element 31 has a first lead terminal 31a, placed on the wiring metal segment 21 and electrically connected thereto, and a second lead terminal 31b, placed on the wiring metal segment 22 and electrically connected thereto. Likewise, the circuit element 31 has a first lead terminal 32a, placed on the wiring metal segment 23 and electrically connected thereto, and a second lead terminal 32b, placed on the wiring metal segment 24 and electrically connected thereto.

Further, the recessed portion 2 is filled with sealing resin such as silicone or epoxy resin covering the circuit elements 31, 32 and the wiring metal segments 21 to 24, which are consequently sealed off from the outside in a hermetically sealing effect. With the resin sealing type circuit device 100 of the present embodiment, the circuit elements 31, 32 have respective longitudinal axes placed in parallel to internal walls 11, 12 of the recessed portion 2.

A hypothetical centerline 91, shown in FIG. 1 in a single dot line, represents a hypothetical center surface of the inner walls 11, 12 of the recessed portion 2. The circuit elements 31, 32 are located on a common plane parallel to a plane of an opening surface of the recessed portion 2 in symmetry with respect to the hypothetical centerline 91.

In addition, with the recessed portion 2 partitioned into first and second compartments 2A, 2B with the hypothetical centerline 91, the circuit element 31 is located in the first compartment 2A at a substantially central area thereof and, likewise, the circuit element 32 is located in the second compartment 2B at a substantially central area thereof.

For the circuit elements 31, 32, use is made of circuit components with identical heat values. When using the circuit elements 31, 32 with the identical heat values, locating these circuit elements 31, 32 in symmetric positions in terms of the hypothetical centerline 91 prevents a localized area of a sealing resin member, filled inside the concaved portion 2, from increasing in temperature. This avoids an uneven temperature distribution of the sealing resin member, thereby achieving a uniform temperature distribution.

Meanwhile, although the resin sealing type circuit device 100 of the present embodiment has been described with reference an exemplary case wherein there are two circuit elements 31, 32, the resin sealing type circuit device 100 may include more than two circuit elements. With such an alternative, these plural circuit elements may be located in the recessed portion 2 on both sides of the hypothetical centerline 91 so as to allow sealing resin members, associated with respective circuit elements inside the concaved portion 2, to be equal in heat value.

Figure 2:
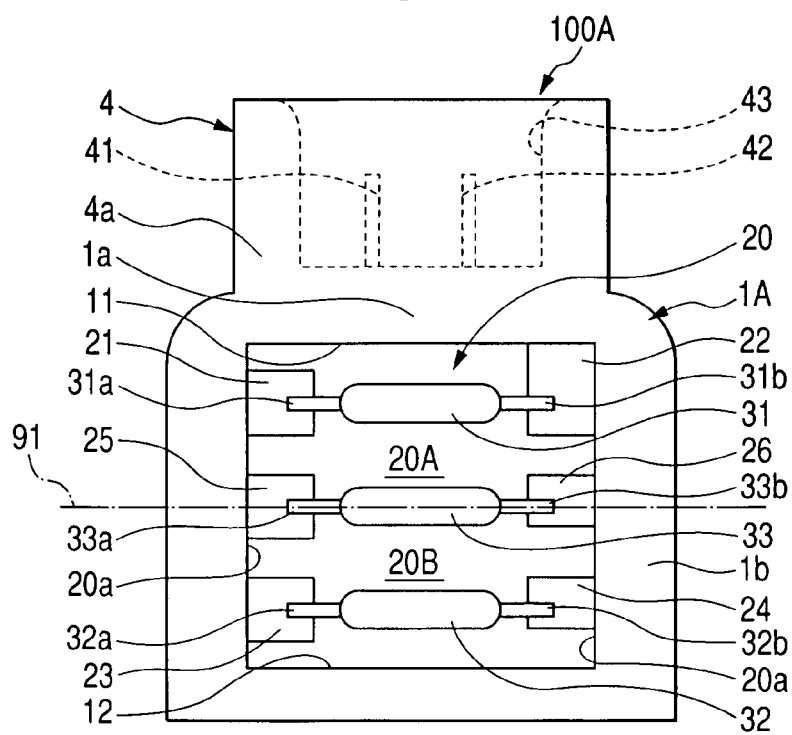
FIG. 2 is a plan view showing a resin sealing type circuit device of a modified form of the embodiment shown in FIG. 1.

FIG. 2 is a plan view showing a resin sealing type circuit device 100A of another embodiment according to the present invention.

With the resin sealing type circuit device 100A of the present embodiment, a recessed portion 20 of a circuit case 1A includes, in addition to the first and second pairs of wiring metal segments 21, 22 and 23, 24, a third pair of wiring metal segments 25, 26.

Further, the resin sealing type circuit device 100A of the present embodiment has the same structure as that of the resin sealing type circuit device 100 of the embodiment shown in FIG. 1 except for that a third electronic element 33 is additionally accommodated in the recessed portion 20 on the hypothetical centerline 91 with the first and second electronic components 31, 32 being located in the recessed portion 20 at adjusted positions.

With the resin sealing type circuit device 100A of the present embodiment shown in FIG. 2, the third pair of wiring metal segments 25, 26 are fixed to the circuit case 1A by insert molding and have inward ends extending from the sidewalls 20a, 20a of the recessed portion 20 to be exposed thereto. The third electronic element 33 has a first lead terminal 33a, placed on the wiring metal segment 25 and electrically connected thereto, and a second lead terminal 31b placed on the wiring metal segment 26 and electrically connected thereto.

With the resin sealing type circuit device 100A of the present embodiment shown in FIG. 2, the first to third circuit elements 31 to 33 have respective longitudinal axes placed in parallel to the inner walls 11, 12. The first to third circuit elements 31 to 33 are located on a common plane parallel to a plane of an opening surface of the recessed portion 20 in symmetry with respect to the hypothetical centerline 91.

In addition, with the recessed portion 20 partitioned into first and second compartments 20A, 20B with the hypothetical centerline 91, the circuit element 31 is located in the first compartment 20A at a substantially central area thereof in an area facing the inner wall 11. Likewise, the circuit element 32 is located in the second compartment 20B at a substantially central area thereof in an area facing the inner wall 12.

For the circuit elements 31 to 33, use is made of circuit components with identical heat values. When using the circuit elements 31 to 33 with the identical heat values, locating these circuit elements 31 to 33 in symmetric positions with respect to the hypothetical centerline 91 prevents a localized area of a sealing resin member, filled inside the concaved portion 20, from increasing in temperature. This avoids an uneven temperature distribution of the sealing resin member, thereby achieving a uniform temperature distribution.

While the resin sealing type circuit devices of the first and second embodiments have been described above with reference to the structure with attention focused on heat developments of the circuit elements placed inside the recessed portion of the circuit device, the present invention may be implemented in another alternative in which a resin-molded integrated circuit is mounted in a circuit case.

Figure 3:
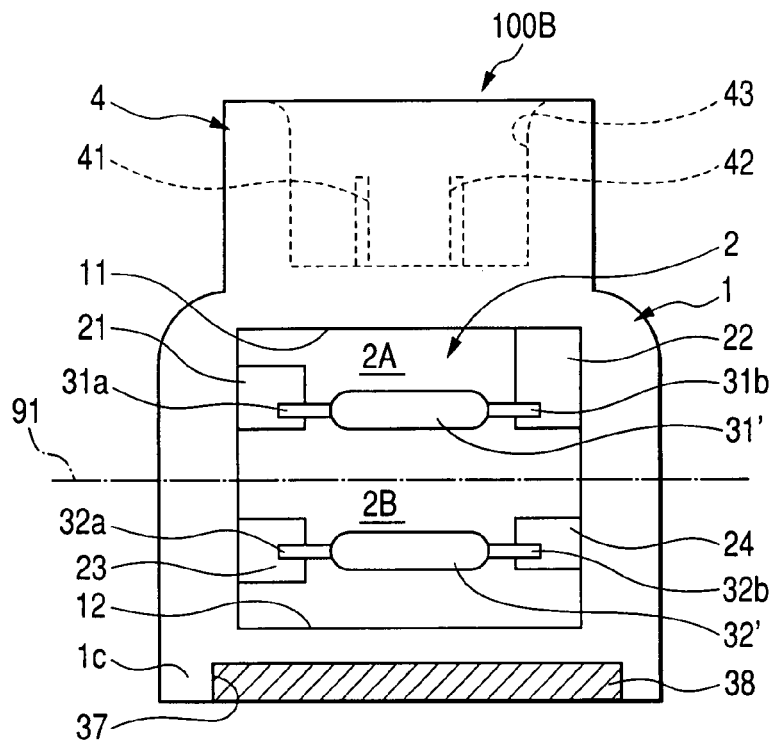
FIG. 3 is a plan view showing a resin sealing type circuit device of another embodiment according to the present invention.

FIG. 3 is a plan view showing a resin sealing type circuit device of another embodiment including an integrated circuit.

The resin sealing type circuit device 100B of the present embodiment, shown in FIG. 3, is similar in structure to the resin sealing type circuit device of the embodiment, shown in FIG. 1, except for that the circuit case 1 has a trailing end 1c, extending in opposition to the leading end 1a, which is formed with a recessed portion 37 laterally extending in parallel to the hypothetical centerline 91 so as to accommodate therein an integrated circuit 38 and that a circuit element 31' has a greater heat value than that of a circuit element 32'.

The integrated circuit 38 plays a role as a heating element with a great heat value in use, that is, when the integrated circuit 38 is under operation. The recessed portion 2 receives heat from the integrated circuit 38 and the temperature of the recessed portion 2 increases. When this takes place, the inner wall 12 of the recessed portion 2 has a higher temperature than that of the inner wall 11 remotest from the integrated circuit 38. This results in uneven temperature distribution of the sealed resin member filled in the recessed portion 2.

To avoid such an occasion, the resin sealing type circuit device of the present embodiment, shown in FIG. 3, is arranged such that the circuit element 31' with a high heat value is located in the first compartment 2A at a position remote from the integrated circuit 38 and the circuit element 32' with a low heat value is located in the second compartment 2B at another position closer to the integrated circuit 38. Locating the circuit element 32', lower in heat value than that of the circuit element 31', in the second compartment 2B at the position closer to the integrated circuit 38 improves uneven temperature distribution of the sealed resin member filled in the recessed portion 2, thereby enabling the sealed resin member to have relatively uniform temperature distribution. In such a case, no need arises for the circuit elements 31', 32' to be placed in symmetry with respect to the hypothetical centerline 91.

With the resin sealing type circuit device of the present embodiment shown in FIG. 3, a circuit element, like the circuit element 31', of the integrated circuit 38 may be mounted in the circuit case 1 separately from the integrated circuit 38. This results in capability for the integrated circuit to obtain a circuit characteristic with increased precision that would otherwise be impossible to be manufactured. For instance, a circuit structure with the integrated circuit 38, employing resistors with resistance values varying in the order of several tens of percentage (%), can be altered to the integrated circuit 38 in a modified circuit structure in which the resistors are composed of discrete circuit elements with resistance values varying in the order of a dozen percentage (%).

Figure 4:
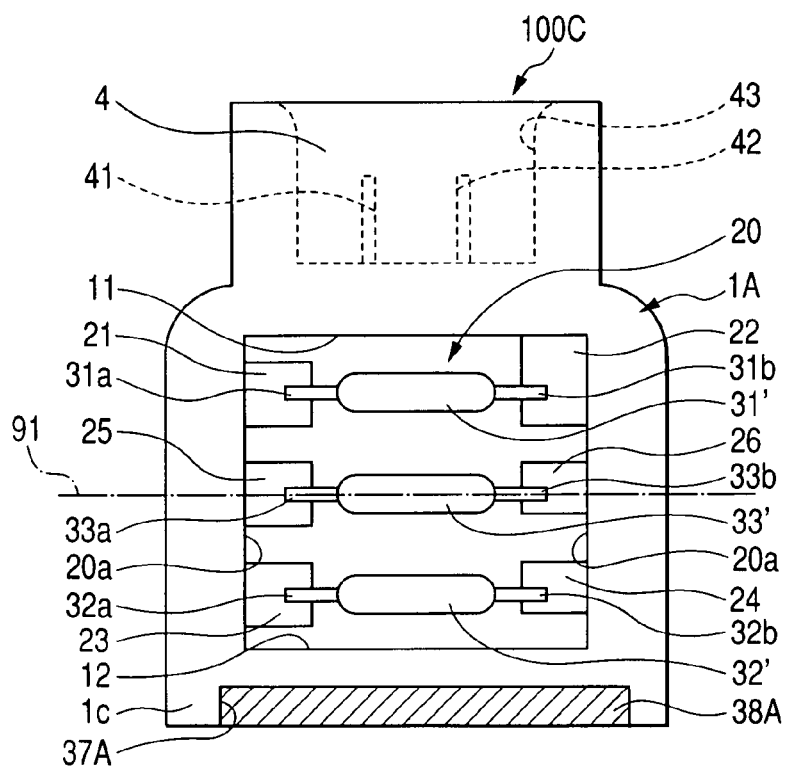
FIG. 4 is a plan view showing a resin sealing type circuit device of a modified form of the embodiment shown in FIG. 3.

FIG. 4 is a plan view of a resin sealing type circuit device of a modified form according to the present invention including an integrated circuit and three circuit elements.

The resin sealing type circuit device 100C of the present embodiment, shown in FIG. 4, is similar in structure to the resin sealing type circuit device of the embodiment, shown in FIG. 2, except for that the circuit case 1A has a trailing end 1c, extending in opposition to the leading end 1a, which is formed with a recessed portion 37A laterally extending in parallel to the hypothetical centerline 91 so as to accommodate therein an integrated circuit 38A and that a circuit element 31' has the highest heat value and circuit element 33', 32' have heat values progressively decreasing in this order.

With the resin sealing type circuit device 100C of the present embodiment shown in FIG. 4, the circuit element 31' with the highest heat value is located in the first compartment 20A at a position remotest from the integrated circuit 38A. Further, the circuit element 33' with a middle heat value is located in the recessed portion 20 at a position in alignment with the hypothetical centerline 91.

Furthermore, the circuit element 32' with the lowest heat value is located in the second compartment 20B at a position closest to the integrated circuit 38A. Thus, permitting the circuit elements 32', 33', 31' to have heat values increasing in this order allows a sealed resin member filled in the recessed portion 20 to have improvement in uneven temperature distribution, thereby enabling the sealed resin member to have relatively uniform temperature distribution. In such a case, no need arises for the circuit elements 31', 33', 32' to be placed in symmetric positions with respect to the hypothetical centerline 91.

While the specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A resin sealing type circuit device comprising:
   a circuit case, made of resin, which has a recessed portion;
   a plurality of circuit elements accommodated in the recessed portion and having lead terminals, respectively;
   wiring metal segments fixedly supported with the circuit case and having lead terminal connecting portions protruding into the recessed portion and electrically connected to the lead terminals of the circuit elements, respectively; and
   a sealing resin filled in the recessed portion and covering the plurality of circuit elements and the lead terminal connecting portions of the wiring metal segments;
   wherein placements of the plurality of circuit elements are determined in consideration for a temperature distribution of the sealing resin,
   wherein the circuit case has one portion receiving therein a heat source other than the circuit elements; and
   wherein the plurality of circuit elements are placed on the same plane parallel to an opening surface of the recessed portion of the circuit case at discrete positions distanced from the heat source and have longitudinal axes parallel to a longitudinal axis of the heat source.

2. The resin sealing type circuit device according to claim 1, wherein:
   the plurality of circuit elements are placed on the same plane parallel to an opening surface of the recessed portion of the circuit case in symmetry with respect to a hypothetical centerline of two opposing inner walls of the recessed portion.

3. The resin sealing type circuit device according to claim 2, wherein:
   the plurality of circuit elements are located in the recessed portion on both sides of the hypothetical centerline to be equaled in a total sum of heat values.

4. The resin sealing type circuit device according to claim 1, wherein:
   the heat source is located in the circuit case at a position in which a temperature of the sealing resin filled in the recessed portion becomes uneven due to heat developed by the heat source in use.

5. The resin sealing type circuit device according to claim 1, wherein:
   the plurality of circuit elements are placed in the recessed portion such that the remoter the distance from the heat source, the greater will be the heat value.

6. The resin sealing type circuit device according to claim 1, further comprising:
   a connector section integrally formed with a leading end of the case body and having a concaved portion to which electric terminals, electrically connected to the wiring metal segments fixedly supported with the circuit case, are exposed.

7. The resin sealing type circuit device according to claim 6, wherein:
   the plurality of circuit elements are placed on the same plane parallel to an opening surface of the recessed portion of the circuit case in symmetry with respect to a hypothetical centerline of two opposing inner walls of the recessed portion.

8. The resin sealing type circuit device according to claim 7, wherein:
   the plurality of circuit elements are located in the recessed portion on both sides of the hypothetical centerline to be equaled in a total sum of heat values.

9. The resin sealing type circuit device according to claim 6, wherein:
   the heat source is located in the circuit case at a position in which a temperature of the sealing resin filled in the recessed portion becomes uneven due to heat developed by the heat source in use.

10. The resin sealing type circuit device according to claim 6, wherein:
    the plurality of circuit elements are placed in the recessed portion such that the remoter the distance from the heat source, the greater will be the heat value.

* * * * *